(12) United States Patent
Nedelcu et al.

(10) Patent No.: US 8,378,301 B2
(45) Date of Patent: Feb. 19, 2013

(54) MULTISPECTRAL IMAGING DEVICE BASED ON MULTIPLE QUANTUM WELLS

(75) Inventors: Alexandru Nedelcu, Bourg la Reine (FR); Philippe Bois, Cesson (FR); Eric Costard, Massy (FR)

(73) Assignee: Thales, Neuilly sur Seine (FR)

( * ) Notice: Subject to any disclaimer, the term of this patent is extended or adjusted under 35 U.S.C. 154(b) by 657 days.

(21) Appl. No.: 12/605,188

(22) Filed: Oct. 23, 2009

(65) Prior Publication Data

US 2010/0108861 A1 May 6, 2010

(30) Foreign Application Priority Data

Oct. 24, 2008 (FR) ...................................... 08 05921

(51) Int. Cl.
*H01L 29/06* (2006.01)
*H01L 29/732* (2006.01)

(52) U.S. Cl. ..................................... 250/339.02; 257/21

(58) Field of Classification Search ................ 250/208.1, 250/237 R, 237 G, 338.1, 338.4, 339.01, 250/339.02; 257/21, E27.13, E31.033
See application file for complete search history.

(56) References Cited

U.S. PATENT DOCUMENTS

| | | | |
|---|---|---|---|
| 5,086,327 A | 2/1992 | Rosencher et al. | |
| 5,187,715 A | 2/1993 | Weisbuch et al. | |
| 5,326,984 A | 7/1994 | Rosencher et al. | |
| 5,506,418 A | 4/1996 | Bois et al. | |
| 5,539,206 A * | 7/1996 | Schimert ..................... | 250/338.4 |
| 5,677,544 A | 10/1997 | Duboz et al. | |
| 5,712,499 A | 1/1998 | Duboz et al. | |
| 5,726,500 A | 3/1998 | Duboz et al. | |
| 5,869,844 A | 2/1999 | Rosencher et al. | |
| 6,091,126 A | 7/2000 | Costard et al. | |
| 6,157,020 A | 12/2000 | Krapf et al. | |
| 6,534,758 B2 | 3/2003 | Costard et al. | |
| 6,627,868 B2 | 9/2003 | Bois et al. | |
| 6,797,938 B2 | 9/2004 | Bois et al. | |
| 6,809,350 B1 | 10/2004 | Berger et al. | |
| 2004/0108564 A1 | 6/2004 | Mitra | |
| 2006/0243892 A1 | 11/2006 | Bois et al. | |
| 2006/0289728 A1 | 12/2006 | Bois et al. | |
| 2008/0158486 A1 * | 7/2008 | Kim et al. ..................... | 349/106 |

FOREIGN PATENT DOCUMENTS

EP 1 174 927 A 1/2002

OTHER PUBLICATIONS

U.S. Appl. No. 07/543,785, filed May 26, 1989.

(Continued)

*Primary Examiner* — Seung C Sohn
(74) *Attorney, Agent, or Firm* — LaRiviere, Grubman & Payne, LLP

(57) ABSTRACT

The invention relates to a multispectral imaging device comprising a multiple-quantum-well structure operating on inter-sub-band transitions by absorbing radiation at a wavelength $\lambda$ lying within a set of wavelengths to which said structure is sensitive, said structure comprising a matrix of individual detection pixels, characterized in that the matrix is organized in subsets ($E_{ij}$) of four individual detection pixels, a first individual detection pixel ($P_{\lambda,1}$) comprising a first diffraction grating ($R_{\lambda,1}$) sensitive to a first subset of wavelengths, a second individual detection pixel ($P_{\lambda,2}$) comprising a second diffraction grating ($R_{\lambda,2}$) sensitive to a second subset of wavelengths, a third individual detection pixel ($P_{\lambda,3}$) comprising a third diffraction grating ($R_{\lambda,3}$) sensitive to a third subset of wavelengths and a fourth individual detection pixel ($P_{A\lambda}$) not comprising a wavelength-selective diffraction grating, the first, second and third subsets of wavelengths belonging to the set of wavelengths to which said structure is sensitive.

12 Claims, 5 Drawing Sheets

OTHER PUBLICATIONS

U.S. Appl. No. 08/054,839, filed Apr. 30, 1993.
U.S. Appl. No. 08/086,862, filed Jul. 7, 1993.

BF Levine, "Quantum-Well Infrared Photodetectors", Journal of Applied Physics, Oct. 15, 1993, vol. 74, No. 8, pp. R01-81.

* cited by examiner

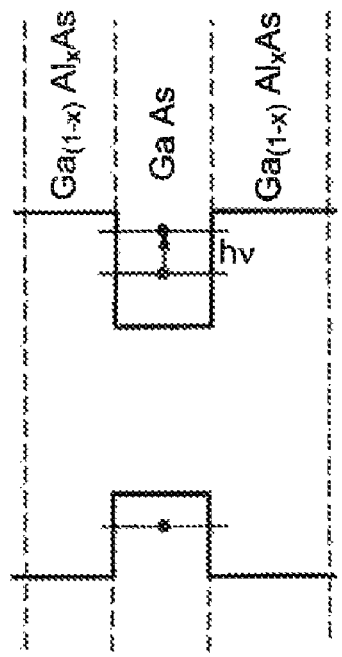
FIG.1 - Prior Art
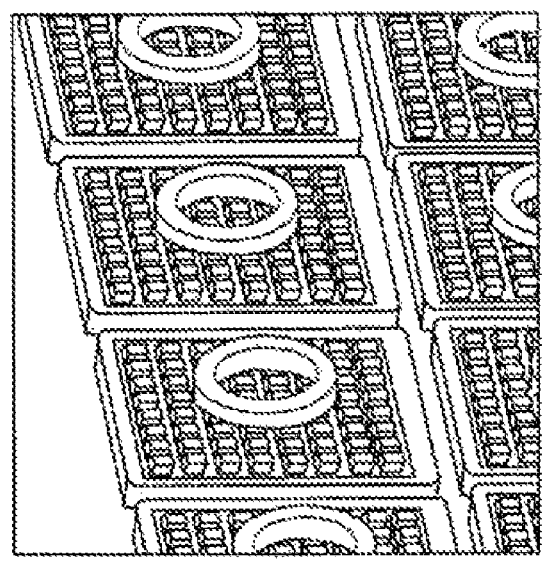
FIG.2 - Prior Art

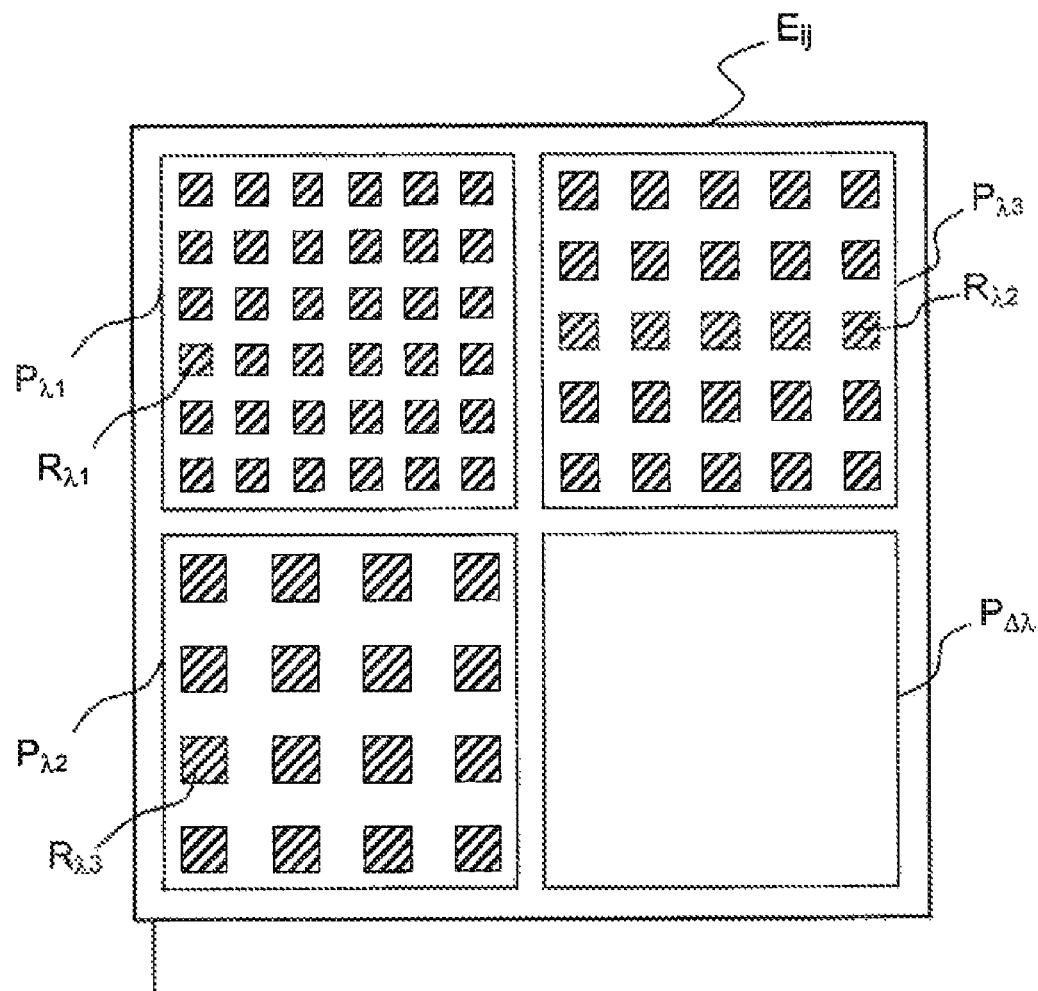
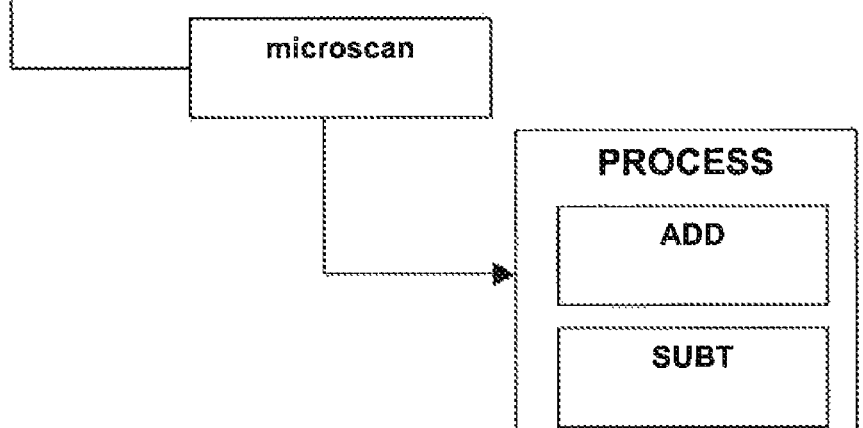
FIG.4

MULTISPECTRAL IMAGING DEVICE BASED ON MULTIPLE QUANTUM WELLS

PRIORITY CLAIM

This application claims priority to French Patent Application Number 08 05921, entitled Dispositif D'Imagerie Multispectral A Base De Multi-Puits Quantiques, filed on Oct. 24, 2008.

FIELD OF THE INVENTION

The field of the invention is that of multispectral thermal imaging devices and notably to imaging devices having a multiple-quantum-well structure, particularly those suitable for the infrared range.

Rapid progress in epitaxial growth on GaAs-type substrates has resulted in the development of a new class of electromagnetic wave detectors using the absorption of radiation around a wavelength $\lambda$ corresponding to the transition of electrons between various energy levels within the same energy band. The diagram in FIG. 1 illustrates this type of transition.

BACKGROUND OF THE INVENTION

Recent advances in the performance of such components are due in particular to the relatively easy fabrication of semiconductor multilayer structures in the standard MBE (molecular beam epitaxy) system, i.e. the GaAs/Ga$_{(1-x)}$Al$_x$As system. By adjusting the growth parameters, the thickness of the quantum wells and the fraction x of aluminium in the barriers imposing the confinement potential, a narrow detection band (about 1 micron in width) may be chosen to be centred on a given wavelength.

This type of structure has the advantage of providing very good sensitivity because of the discretization of the energy levels within the conduction bands of the photoconductive materials used.

Thus, multiple-quantum-well detectors are recognized as providing a very good technical solution for fabricating matrices sensitive to infrared radiation within the 8-12 μm band.

In the context of inter-sub-band transitions, in order for this type of transition to be possible it is necessary for the electric field of the incident electromagnetic wave to have a component along the growth direction of the layers, said direction being perpendicular to the plane of the layers. The consequence of this physical effect is that a detector exhibits little absorption in the case of illumination at normal incidence.

It has already been proposed to use coupling means of the diffraction grating type (cf. Goossen and Lyon, Appl. Phys. Lett. 47, 1257-1259 (1985)) for generating said perpendicular component by creating diffracted radiation. Thus, a diffraction grating operating in reflection may be etched on each pixel (the detectors are back-lit) as described in the article "Grating-coupled quantum-well infrared detectors: Theory and performance", J. Y. Anderson and L. Lundqvist, J. Appl. Phys. 71, 3600 (1992) and illustrated in FIG. 2, which demonstrates the use of arrays of studs for coupling the incident radiation whatever its polarization, through a view, performed by an electron microscope, of pixels about 20 microns in width, said pixels having, on their surface, diffraction gratings, the upper ring being merely an element for attachment to a matrix of read circuits on silicon.

The assembly formed by the matrix of pixels produced within the multiple-quantum-well structure and by the diffraction gratings is called hereafter the "focal plane".

In general, a multiple-quantum-well structure makes it possible to produce layers, and therefore detectors, which are sensitive in very narrow wavelength ranges of the order of 10% (a wavelength variation $\Delta\lambda/\lambda$ of the order of 10%).

However, this type of active structure does not allow the production of imaging devices capable of operating within broad wavelength spectra despite the very high sensitivity that they nevertheless can achieve.

SUMMARY OF THE INVENTION

This is why it has been proposed in the present invention to replace the standard active layer, which generally comprises a stack of semiconductor layers for producing the multiple-quantum-well structure generally sensitive within a very narrow wavelength range, typically having a spectral bandwidth of about 10%, by a broadband active layer obtained by alternating different quantum wells. It is thus possible to fabricate multispectral focal planes.

More precisely, the subject of the present invention is a multispectral imaging device comprising a multiple-quantum-well structure operating on inter-sub-band transitions by absorbing radiation at a wavelength $\lambda$ lying within a set of wavelengths to which said structure is sensitive, said structure comprising a matrix of individual detection pixels, characterized in that the matrix is organized in subsets of four individual pixels, a first detection pixel comprising a first diffraction grating sensitive to a first subset of wavelengths, a second detection pixel comprising a second diffraction grating sensitive to a second subset of wavelengths, a third detection pixel comprising a third diffraction grating sensitive to a third subset of wavelengths and a fourth pixel not comprising a wavelength-selective diffraction grating, the first, second and third subsets of wavelengths belonging to the set of wavelengths to which said structure is sensitive.

According to one embodiment of the invention, the fourth pixel does not comprise a diffraction grating.

According to one embodiment of the invention, the fourth pixel comprises a non-wavelength-selective optical coupling structure.

According to one embodiment of the invention, the device further includes means for processing the signals recovered from the individual detection pixels.

According to one embodiment of the invention, the signal processing means comprise means for summing the signals coming from the first, second and third individual detection pixels respectively and means for subtracting the signal coming from the fourth individual detection pixel.

According to one embodiment of the invention, the first, second and third diffraction gratings are one-dimensional gratings having lamellar features.

According to one embodiment of the invention, the device comprises a multilayer stack produced on the surface of a substrate, said stack comprising the multiple-quantum-well structure and external layers, periodic features being etched within an external layer so as to produce the different gratings.

According to one embodiment of the invention, the multiple-quantum-well structure comprises a set of variable semiconductor multilayer stack substructures so as to make said structure sensitive to a set of wavelengths.

According to one embodiment of the invention, the multilayer stack is a stack of layers of the doped GaAs or GaAlAs type, the substrate being of the undoped GaAs type.

According to one embodiment of the invention, the multiple-quantum-well structure is made up of a stack of doped GaAs or InGaAs layers (constituting the wells) and undoped AlGaAs or InAlAs layers (constituting the barriers), the substrate being of the undoped GaAs or InP type and the external layers being GaAs-based ohmic contact layers more highly doped than those making up the multiple-quantum-well structure.

According to one embodiment of the invention, the device comprises a substrate which is transparent at the wavelength of the incident radiation and a layer which is reflective at said wavelength, said reflective layer being on the surface of the diffraction gratings, so as to make the detector operate in reflection.

According to one embodiment of the invention, the device further includes microscanning means for taking a series of images containing different spectral information.

The invention will be better understood and other advantages will become apparent on reading the following description given by way of non-limiting example and thanks to the appended figures, in which:

BRIEF DESCRIPTION OF THE DRAWINGS

FIG. 1 illustrates a multiple-quantum-well structure according to the known art;

FIG. 2 illustrates an imager structure comprising a 2-D grating;

FIG. 4 illustrates a subset $E_{ij}$ comprising four individual detection pixels;

DETAILED DESCRIPTION OF THE INVENTION

The device of the invention is an imaging device comprising a structure that absorbs within a range of wavelengths and comprising individual sets of diffraction gratings enabling a given wavelength to be selected at a given individual pixel thanks to a diffraction grating, the various wavelengths being selected by modifying the spatial period of the coupling grating.

The imaging device of the invention thus comprises a focal plane architecture notably compatible with imaging at three wavelengths lying within a relatively narrow spectral band, the imaging being optimized from the standpoint of spectral coverage as described notably in the article "Spectral crosstalk in dual-band quantum well infrared detectors", A. Nedelcu, X. Marcadet, O. Huet and P. Bois, Appl. Phys. Lett. 88, 191113 (2006).

Figure 3A:
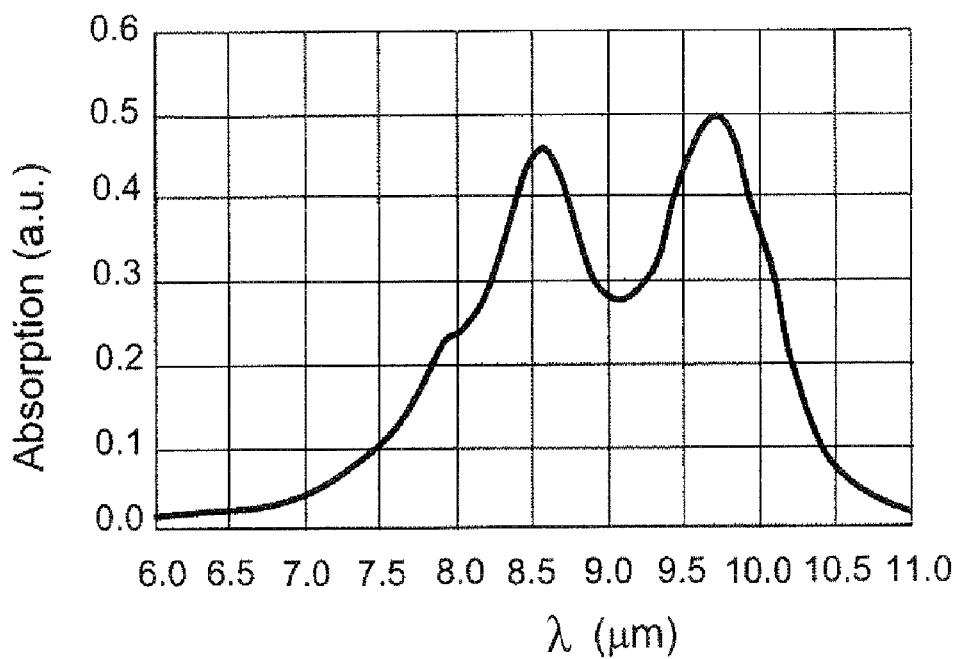
FIGS. 3a and 3b respectively illustrate the absorption curves obtained with a focal plane comprising a multiple-quantum-well structure without a selective diffraction grating and with a selective diffraction grating, respectively.

The invention is applicable to all multiple-quantum-well detectors within the entire 3-20 μm infrared spectrum. It provides maximum advantage when the three detected wavelengths are close together.

b By replacing the standard active layer (10% spectral bandwidth) by a broadband active layer (obtained by alternating different quantum wells), it is possible to fabricate multispectral focal planes. The various wavelengths are selected by modifying the spatial period of the coupling grating. In this regard, FIGS. 3a and 3b illustrate the intrinsic absorption of a multiple-quantum-well structure and the absorption obtained by using two gratings of different periods, respectively.

Figure 3B:
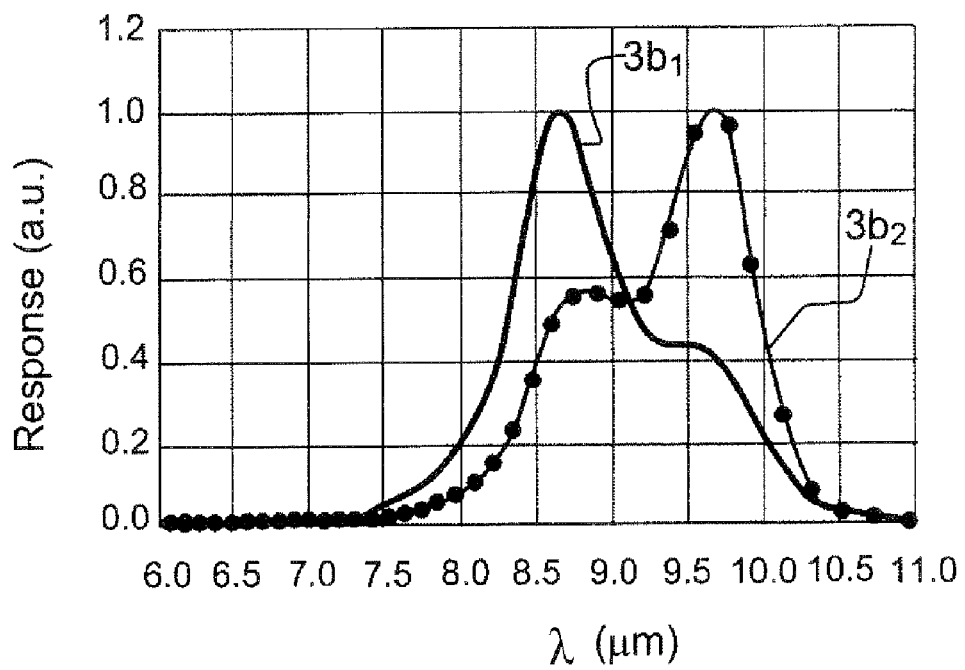

More precisely, FIG. 3b shows, by curve $3b_1$, the absorption obtained with a 2-D grating of 2.7 micron period and, by curve $3b_2$, the absorption obtained with a 2-D grating of 3 micron period. Curve $3b_1$ shows greater sensitivity at 8.8 microns, while curve $3b_2$ shows greater sensitivity at 9.8 microns.

In general, the focal plane produced according to the invention and used in a device of the invention comprises an MQW (multiple quantum well) structure comprising a set of detection elements on the surface of which selectively wavelength-sensitive diffraction gratings have been produced.

More precisely, this set of detection elements comprises subassemblies $E_{ij}$ made up of three individual pixels $P_{\lambda 1}$, $P_{\lambda 2}$ and $P_{\lambda 3}$ each comprising respectively a first diffraction grating $R_{\lambda 1}$ sensitive in a first subset of wavelengths centred on a first wavelength $\lambda_1$, a second diffraction grating $R_{\lambda 2}$ sensitive in a second subset of wavelengths centred on a second wavelength $\lambda_2$ and a third diffraction grating $R_{\lambda 3}$ sensitive in a third subset of wavelengths centred on a third wavelength $\lambda_3$, and one broad-spectral-band individual pixel $P_{\Delta\lambda}$, as illustrated in FIG. 4.

The first, second and third gratings $R_{\lambda 1}$, $R_{\lambda 2}$ and $R_{\lambda 3}$ have different grating periods $\Lambda_1$, $\Lambda_2$ and $\Lambda_3$ respectively.

The fourth individual detection pixel is not provided with an optical coupling structure and has a broadband response due to the optical coupling via the edges of the pixel.

To maintain image resolution, a microscanning system is used. Four video frames are necessary for constructing four images containing different spectral information. The active layer is optimized so as to allow operation at a high frame rate (200 Hz, with an integration time of 5 ms), thereby permitting operation at a rate close to 50 Hz after processing, the optimization parameters being notably the level of doping of the layers, the thicknesses, number of quantum wells and the optical coupling means.

Advantageously, the multispectral imaging device further includes signal processing means for subtracting the signal from the individual pixel not having a wavelength diffraction grating. Thus, it is possible for the curve shown in FIG. 3a to be typically subtracted from the curves illustrated in FIG. 3b, thereby making it possible to reduce the spectral overlap and to increase the contrast between the three channels relating to the information recovered from the first, second and third individual pixels respectively.

Figure 5:
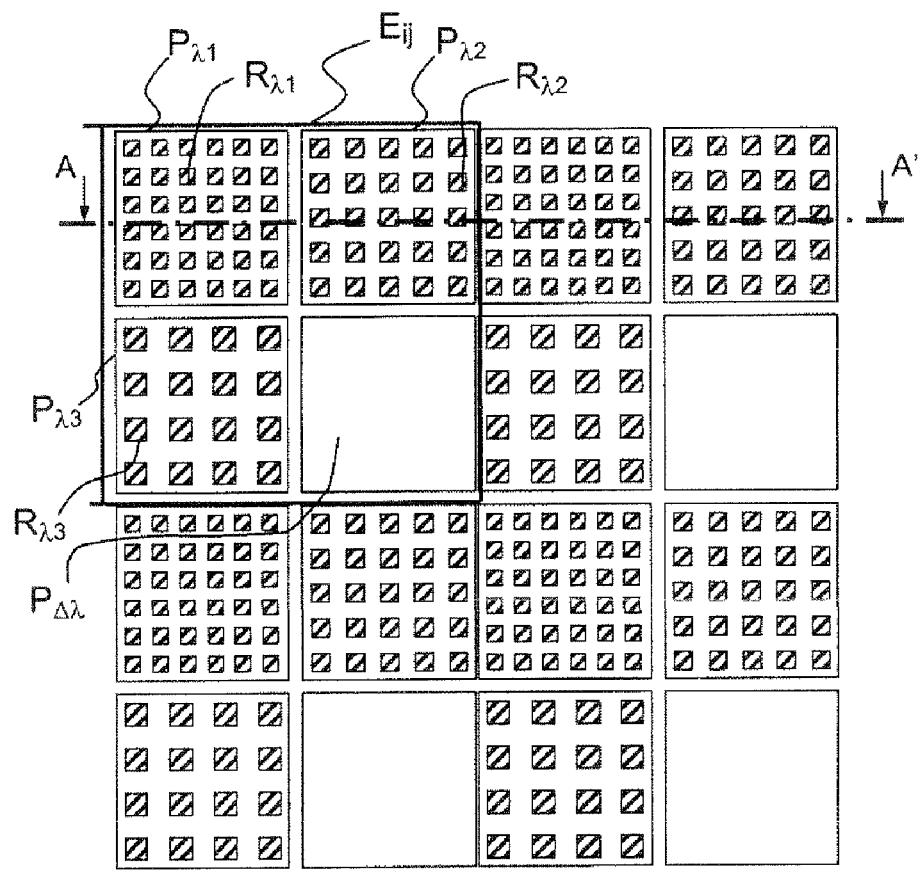
FIG. 5 illustrates an example of a focal plane used in an imaging device according to the invention.

FIG. 5 thus illustrates a top view of a focal plane according to the invention comprising a matrix of subsets $E_{ij}$.

Figure 6:
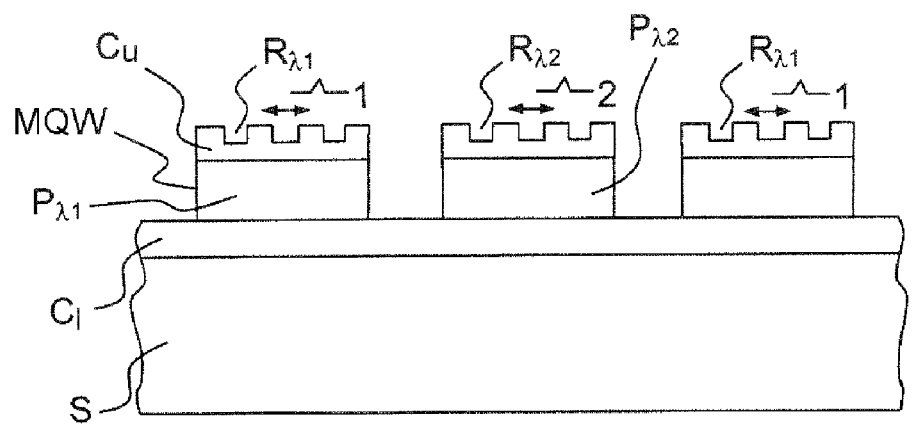
FIG. 6 illustrates a sectional view of a focal plane according to the invention, such as the one shown in FIG. 5.

As is known, the imaging device of the invention may be produced on the surface of a substrate S made of a semiconductor. An assembly of layers is then produced on the surface of this semiconductor, said assembly constituting what is called a lower ohmic contact $C_1$ made of a highly doped semiconductor, which is deposited on the surface of the substrate. This ohmic contact supports all the semiconductor layers constituting the MQW structure, the latter being in contact with an assembly of layers constituting what is called an upper ohmic contact $C_u$, detection taking place between the two ohmic contacts. Advantageously, the diffraction gratings consisting of periodic features may be etched in the upper ohmic contact layer as illustrated in FIG. 6, which shows a sectional view looking along the axis AA' shown in FIG. 5.

Embodiment of an Imaging Device According to the Invention

We will now describe an embodiment of an imaging device operating within a set of wavelengths lying between 8 μm and 11 μm according to the invention, operating within the infrared range and more particularly suitable for the 8-11 micron range.

The table below describes the multilayer stack used in this embodiment. The ×10 indicates that the pattern described is repeated ten times. The stack is described starting from the substrate going up to the upper layer, the ohmic contacts being made in GaAs with a dopant content of $10^{18}$ cm$^{-3}$, the substrate being made of GaAs.

| | | | | |
|---|---|---|---|---|
| $Al_xGa_{1-x}As$ | Barrier $X_{Al}$ = 26% | undoped | 35 nm | ×10 |
| $Al_xGa_{1-x}As$ | Well $X_{Al}$ = 3% | doped Si $2 \times 10^{11}$ cm$^{-2}$ | 5.5 nm | |
| $Al_xGa_{1-x}As$ | Barrier $X_{Al}$ = 26% | undoped | 35 nm | |
| GaAs | Well | doped Si $2 \times 10^{11}$ cm$^{-2}$ | 5 nm | |
| $Al_xGa_{1-x}As$ | Barrier $X_{Al}$ = 26% | undoped | 35 nm | |

Figure 7:
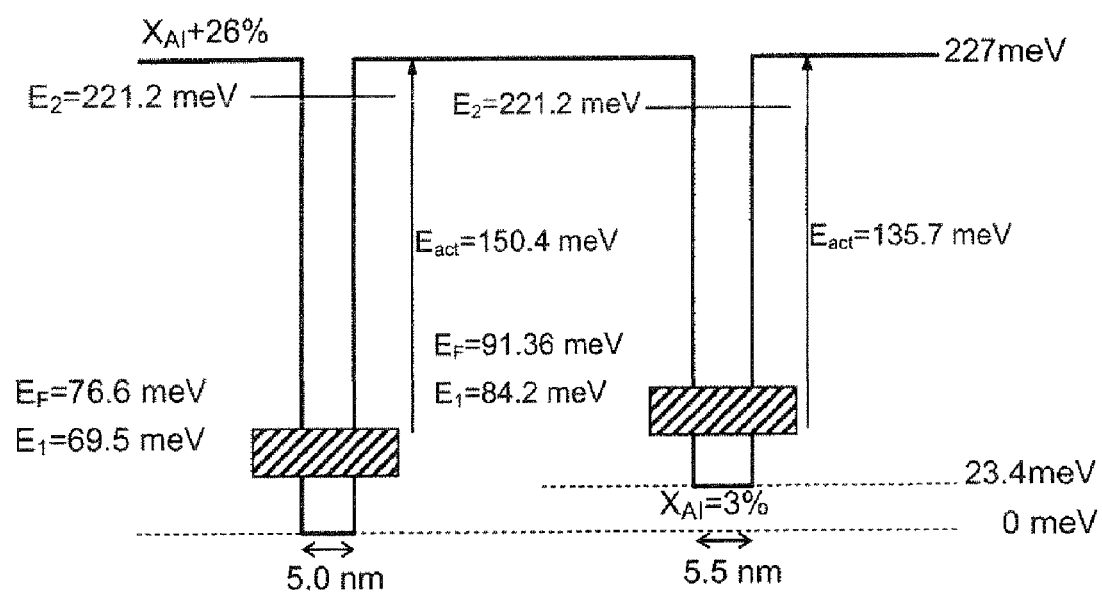
FIG. 7 illustrates a band structure obtained with quantum wells and barriers used in an example of a multilayer stack for an imaging device according to the invention.

The band structure obtained with these examples of quantum wells and barriers, associated with a period (two wells), is illustrated in FIG. 7 which shows the inter-sub-band energy levels, for a fraction x in the $Al_xGa_{1-x}As$ alloy of 0.26.

The invention claimed is:

1. Multispectral imaging device located on the surface of a substrate comprising a multiple-quantum-well structure operating on inter-sub-band transitions by absorbing radiation at a wavelength λ lying within a set of wavelengths to which said structure is sensitive, said structure comprising a matrix of individual detection pixels, wherein the matrix is organized in subsets ($E_{ij}$) of four individual detection pixels, a first individual detection pixel ($P_{\lambda 1}$) comprising a first diffraction grating ($R_{\lambda 1}$) sensitive to a first subset of wavelengths, a second individual detection pixel ($P_{\lambda 2}$) comprising a second diffraction grating ($R_{\lambda 2}$) sensitive to a second subset of wavelengths, a third individual detection pixel ($P_{\lambda 3}$) comprising a third diffraction grating ($R_{\lambda 3}$) sensitive to a third subset of wavelengths and a fourth individual detection pixel ($P_{A\lambda}$) not comprising a wavelength-selective diffraction grating, the first, second and third subsets of wavelengths belonging to the set of wavelengths to which said structure is sensitive.

2. Multispectral imaging device according to claim 1, wherein the fourth individual detection pixel does not comprise a diffraction grating.

3. Multispectral imaging device according to claim 1, wherein the fourth individual detection pixel comprises a non-wavelength-selective optical coupling structure.

4. Multispectral imaging device according to one of claims 1 to 2, including means for processing the signals recovered from the individual detection pixels.

5. Multispectral imaging device according to claim 4, wherein the signal processing means comprise means for summing the signals coming from the first, second and third individual detection pixels respectively and means for subtracting the signal coming from the fourth individual detection pixel.

6. Multispectral imaging device according to one of claims 1 to 2, wherein the first, second and third diffraction gratings are one-dimensional gratings having lamellar features.

7. Multispectral imaging device according to claim 6, comprising a multilayer stack produced on the surface of a substrate, said stack comprising the multiple-quantum-well structure and external layers, periodic features being etched within an external layer so as to produce the different gratings.

8. Multispectral imaging device according to claim 7, wherein the multiple-quantum-well structure comprises a set of variable semiconductor multilayer stack substructures so as to make said structure sensitive to a set of wavelengths.

9. Multispectral imaging device according to claim 7, wherein the multilayer stack is a stack of layers of the doped GaAs or InGaAs type, constituting the wells, and layers of the undoped AlGaAs or InAlAs type, constituting the barriers, the substrate being of the undoped GaAs or InP type.

10. Multispectral imaging device according to claim 9, wherein the multiple-quantum-well structure is composed of a stack of doped GaAs layers and of undoped GaAlAs layers, the external layers being GaAs-based ohmic contact layers that are more highly doped than those making up the multiple-quantum-well structure.

11. Multispectral imaging device according to claim 9, comprising a substrate which is transparent at the wavelength of the incident radiation and a layer which is reflective at said wavelength, said reflective layer being on the surface of the diffraction gratings, so as to make the detector operate in reflection.

12. Multispectral imaging device according to claim 1, including microscanning means for taking a series of images containing different spectral information.

* * * * *